(12) United States Patent
Sakurai et al.

(10) Patent No.: US 11,474,161 B2
(45) Date of Patent: Oct. 18, 2022

(54) POWER SUPPLY SEMICONDUCTOR INTEGRATED CIRCUIT

(71) Applicants: Kohei Sakurai, Atsugi (JP); Shinichiro Maki, Hiratsuka (JP)

(72) Inventors: Kohei Sakurai, Atsugi (JP); Shinichiro Maki, Hiratsuka (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/458,113

(22) Filed: Aug. 26, 2021

(65) Prior Publication Data

US 2022/0075004 A1 Mar. 10, 2022

(30) Foreign Application Priority Data

Sep. 7, 2020 (JP) .............................. JP2020-149605

(51) Int. Cl.
  *G05F 1/10* (2006.01)
  *G05F 3/02* (2006.01)
  (Continued)

(52) U.S. Cl.
  CPC ....... *G01R 31/52* (2020.01); *G01R 19/16576* (2013.01); *G05F 1/56* (2013.01);
  (Continued)

(58) Field of Classification Search
  CPC ..................................... G05F 1/10; G05F 1/46
  (Continued)

(56) References Cited

U.S. PATENT DOCUMENTS

| 8,847,569 B2 | 9/2014 | Terada et al. |
| 9,996,093 B2 | 6/2018 | Takano et al. |

(Continued)

FOREIGN PATENT DOCUMENTS

| JP | 2017045096 A | 3/2017 |
| JP | 2018055545 A | 4/2018 |

OTHER PUBLICATIONS

U.S. Appl. No. 17/458,048, First Named Inventor: Kohei Sakurai; Title: "Power Supply Semiconductor Integrated Circuit", filed Aug. 26, 2021.

*Primary Examiner* — Quan Tra
(74) *Attorney, Agent, or Firm* — Holtz, Holtz & Volek PC

(57) ABSTRACT

A power supply semiconductor integrated circuit includes an output transistor, a control circuit, a first-fault detection circuit, a second-fault detection circuit, a delay circuit, and a latch circuit. The output transistor is connected between a voltage-input terminal to which a DC voltage is input and a voltage-output terminal. The control circuit controls the output transistor. The first-fault detection circuit detects a first fault. The second-fault detection circuit detects a second fault different from the first fault. The delay circuit delays an output of the first-fault detection circuit and an output of the second-fault detection circuit. The latch circuit captures and holds an output of the delay circuit. The delay circuit includes: a constant current source for charging a delay capacitor; a discharge switch for discharging the delay capacitor; and a voltage comparator circuit that compares a charge voltage across the delay capacitor and a predetermined voltage.

7 Claims, 7 Drawing Sheets

(51) Int. Cl.
    *G01R 31/52*    (2020.01)
    *H03K 3/037*    (2006.01)
    *G05F 1/56*     (2006.01)
    *G01R 19/165*   (2006.01)
    *H03K 5/24*     (2006.01)
    *H03K 5/00*     (2006.01)

(52) U.S. Cl.
    CPC .............. *H03K 3/037* (2013.01); *H03K 5/24* (2013.01); *H03K 2005/00013* (2013.01)

(58) Field of Classification Search
    USPC ........................................................ 327/538
    See application file for complete search history.

(56) References Cited

U.S. PATENT DOCUMENTS

| | | |
|---|---|---|
| 10,063,135 B2 | 8/2018 | Maki et al. |
| 2009/0237142 A1* | 9/2009 | Matsuda ........... H02J 7/007192 327/512 |
| 2017/0063232 A1 | 3/2017 | Takano et al. |
| 2018/0097439 A1 | 4/2018 | Maki et al. |
| 2019/0179352 A1 | 6/2019 | Sakurai |
| 2020/0371538 A1 | 11/2020 | Maki et al. |
| 2021/0191440 A1 | 6/2021 | Takano et al. |

* cited by examiner

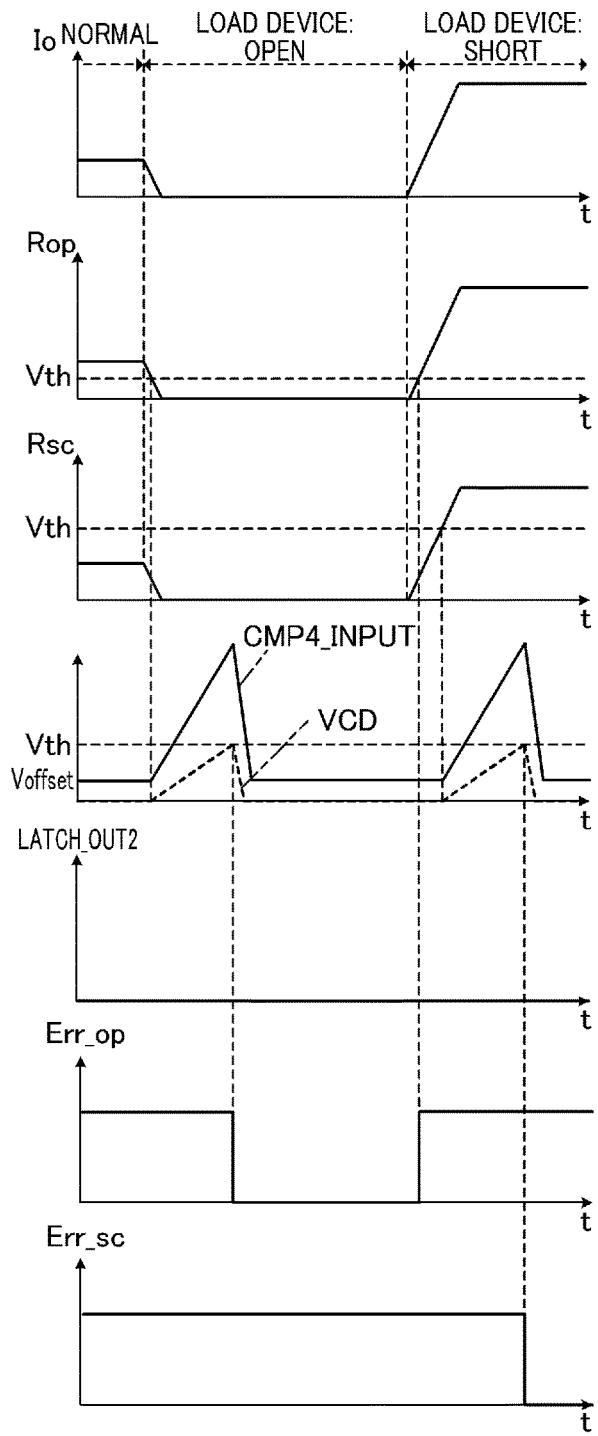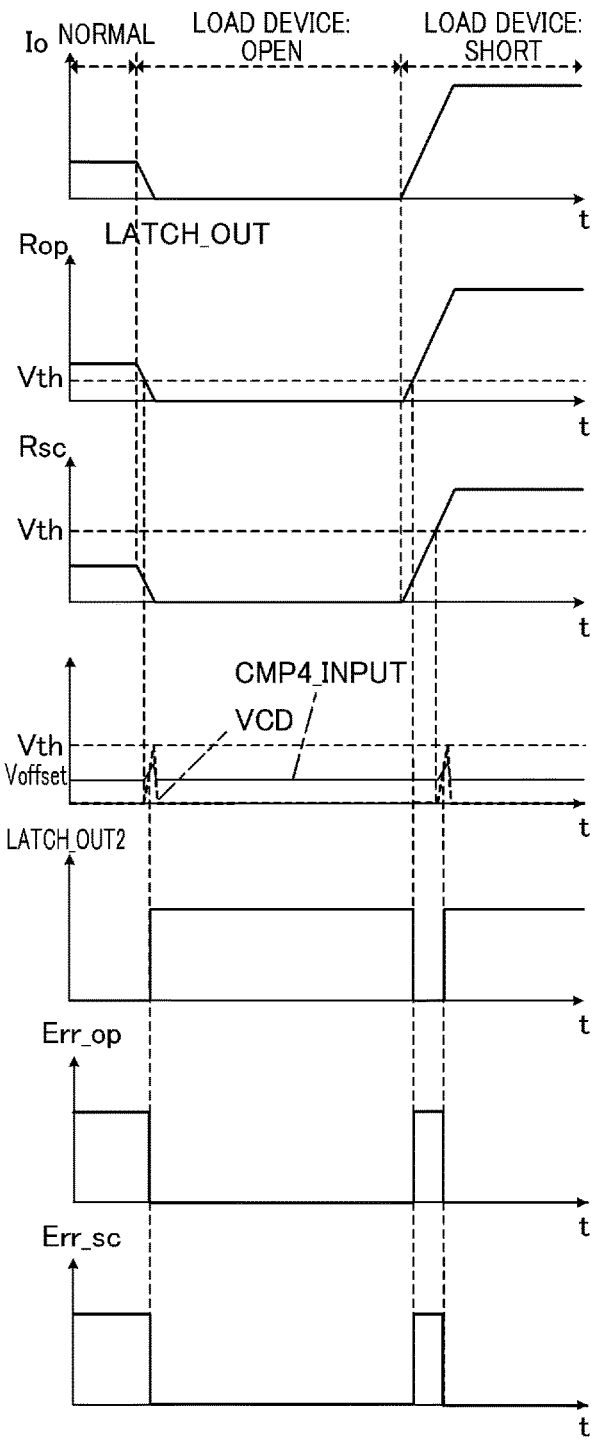

PRIOR ART

POWER SUPPLY SEMICONDUCTOR INTEGRATED CIRCUIT

CROSS-REFERENCE TO RELATED APPLICATIONS

The entire disclosure of Japanese Patent Application No. 2020-149605 filed on Sep. 7, 2020 is incorporated herein by reference in its entirety.

BACKGROUND

The present disclosure relates to a technology that is effectively applied to a power supply semiconductor integrated circuit (power supply IC) that constitutes a voltage regulator, such as a series regulator for converting a DC voltage, or a power supply switch for applying the voltage of a power supply device without change to a load and shutting down the voltage to the load.

BACKGROUND ART

A series regulator (hereinafter called regulator) is known as a power supply device that controls a transistor provided between a DC voltage-input terminal and a voltage-output terminal and outputs a DC voltage at a desired electronic potential.

An onboard regulator is usually connected via a connector to an onboard electronic device, such as a car navigation device. The connector may be disconnected from the power supply owing to shakings of the vehicle, leaving the output terminal of the power supply device open. Further, a short circuit may occur in the load electronic device. An onboard regulator is therefore required to detect such faults.

For example, JP2017-45096A and JP2018-55545A disclose an invention that relates to a semiconductor integrated circuit for a regulator (regulator IC), as shown in FIG. 6. The regulator IC includes a comparator CMP1 for detecting an open-circuit fault of the output terminal, a comparator CMP2 for detecting a short-circuit fault, and a delay circuit DLY for delaying the outputs of the open-circuit-fault detection circuit and the short-circuit-fault detection circuit. The regulator IC generates fault detection signals Err_op, Err_sc on the basis of the signals delayed by the delay circuit and outputs the generated signals from output terminals. The delay circuit is provided so as not to wrongly output fault detection signals from the short-circuit-fault detection circuit owing to rush currents that flow to the capacitor Co connected to the output terminal when the regulator IC is activated.

SUMMARY

According to the regulator IC provided with the delay circuit as shown in FIG. 6, when the load device that has not been connected to the output terminal OUT is connected to the output terminal OUT, the voltage VCD at the external terminal CD to which the delay-setting capacitor Cd is connected increases to a quite high level. Due to this, the capacitor Cd does not have enough discharge time (Td in FIG. 7A). As a result, the regulator IC fails to detect that the open circuit of the output terminal is resolved, and outputs the error pulse EP1 on the short-circuit-fault detection signal Err_sc. Similarly, when a short circuit occurs in the load device and is thereafter resolved, the delay-setting capacitor does not have enough discharge time. As a result, the regulator IC fails to detect that the short circuit is resolved, and outputs the error pulse EP2 on the open-circuit-fault detection signal Err_op, as shown in FIG. 7B. A similar problem also occurs in a power supply switch IC that has a configuration similar to the regulator IC and that supplies the voltage of the power supply device (e.g., battery) without change to the load and shuts down the supply of the voltage.

The present invention has been conceived in view of the above issues. Objects of the present invention include providing a power supply IC (e.g., regulator IC or power supply switch IC) that includes circuits for detecting two or more types of faults (e.g., short-circuit fault and open-circuit fault of the output terminal) and a delay circuit for delaying fault detection signals and that restrains occurrence of error pulses on the fault detection signals when faults are resolved.

The objects of the present invention further include providing a power supply circuit (e.g., regulator IC or power supply switch IC) capable of outputting fault detection signals to outside in response to detecting abnormalities (e.g., the delay-setting capacitor is disconnected from the external terminal).

To achieve at least one of the abovementioned objects, according to an aspect of the present invention, there is provided a power supply semiconductor integrated circuit including: an output transistor connected between a voltage-input terminal to which a DC voltage is input and a voltage-output terminal; a control circuit that controls the output transistor; a first-fault detection circuit that detects a first fault; a second-fault detection circuit that detects a second fault different from the first fault; a delay circuit that delays an output of the first-fault detection circuit and an output of the second-fault detection circuit; and a latch circuit that captures and holds an output of the delay circuit, wherein the delay circuit includes: a constant current source for charging a delay capacitor; a discharge switch for discharging the delay capacitor; and a voltage comparator circuit that compares a voltage across the delay capacitor and a predetermined voltage.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein:

FIG. 4A is a timing chart showing changes in voltage at each part of the regulator IC in the modification in FIG. 3 when the state of the IC changes from an open-circuit state to a short-circuit state while a delay capacitor is connected to an external terminal;

FIG. 4B is a timing chart showing changes in voltage at each part of the regulator IC in the modification in FIG. 3 when the state of the IC changes from an open-circuit state to a short-circuit state and when a delay circuit has an abnormality (e.g., the delay capacitor is disconnected);

DESCRIPTION OF EMBODIMENTS

Hereinafter, one or more embodiments of the present invention are described with reference to the drawings. However, the present invention is not limited to the disclosed embodiments.

Figure 1:
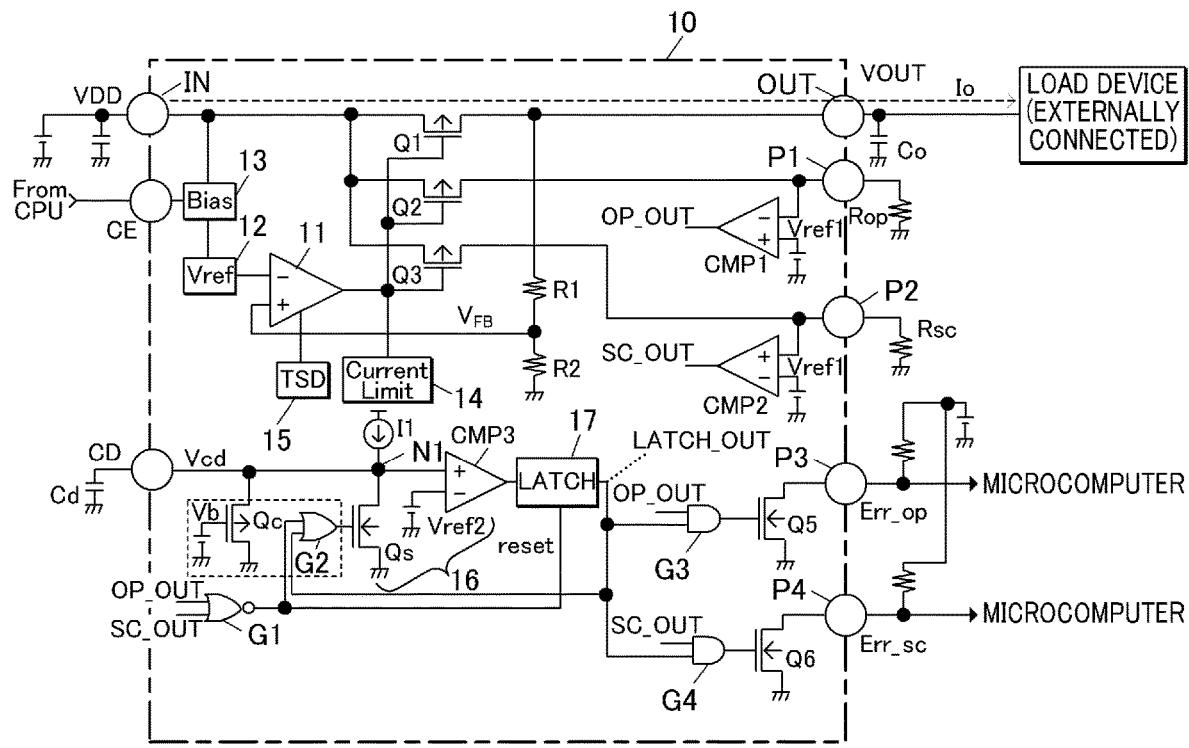
FIG. 1 is a circuit configuration of a regulator IC as an embodiment of the present invention.

FIG. 1 shows an embodiment of a series regulator as a DC power supply device to which the present invention is applied. In FIG. 1, the region enclosed by the alternate long and short dash line is a semiconductor integrated circuit (regulator IC) 10 formed on a semiconductor chip, such as a single crystal silicon. The output terminal OUT of the regulator IC 10 is connected to a capacitor Co. The regulator IC 10 functions as a DC power supply device that supplies a stable DC voltage.

As shown in FIG. 1, in the regulator IC 10 in this embodiment, a voltage-control P-channel MOS transistor Q1 is connected between a voltage-input terminal IN to which a DC voltage VDD is applied and a voltage-output terminal OUT; and bleeder resistors R1, R2 for dividing an output voltage Vout are connected in series between the voltage-output terminal OUT and a ground line to which a ground potential GND is applied.

The voltage VFB divided by the resistors R1, R2 for dividing the output voltage is applied as feedback to a non-inverting input terminal of an error amplifier 11. The error amplifier 11 is an error amplifier circuit that controls a gate terminal of the voltage-control transistor Q1. On the basis of the potential difference between the feedback voltage VFB of the output voltage and a predetermined reference voltage Vref, the error amplifier 11 controls the voltage-control transistor Q1 such that the output voltage Vout is at a desired potential.

The regulator IC 10 in this embodiment further includes: a voltage reference circuit 12 that generates the reference voltage Vref to be applied to the inverting input terminal of the error amplifier 11; a bias circuit 13 that sends operation currents to the error amplifier 11 and the voltage reference circuit 12; a current limit circuit 14 that is connected to the gate terminal of the voltage-control transistor Q1 and that limits output currents; and a thermal shutdown circuit 15 that stops operation of the error amplifier 11 to turn off the transistor Q1 when the temperature of the chip is equal to or higher than a predetermined temperature. CE is an external terminal to which signals for turning on/off the regulator IC.

The voltage reference circuit 12 can be constituted of resistors in series or a Zener diode. The bias circuit 13 has a function of supplying/stopping supplying bias currents to the error amplifier 11 according to control signals input to the external terminal CE by, for example, an external microcomputer (CPU). When the output current increases and the output voltage decreases owing to, for example, a fault in the load; and the error amplifier 11 decreases the gate voltage so that more currents flow through the transistor Q1, the current limit circuit 14 limits the output current Io with clamping so that a drain current does not become equal to or greater than a predetermined level.

The regulator IC 10 in this embodiment further includes transistors Q2, Q3 connected in parallel with the voltage-control transistor Q1. The transistors Q1, Q2, Q3 constitute a current mirror circuit. The gate terminals (control terminals) of the transistors Q2, Q3 receive the same voltage as the voltage applied to the gate terminal of the voltage-control transistor Q1. Accordingly, currents that flow through the transistors Q2, Q3 correspond to the element size ratios N of the transistors Q2, Q3 to the transistor Q1 and are therefore proportional (1/N current) to the drain current of the transistor Q1. When the transistor Q1 consists of N transistors of the same size connected in parallel (N is the number of transistors) and the transistors Q2, Q3 each consist of a single transistor, the currents flowing through these transistors are proportional to the number of elements.

The regulator IC 10 in this embodiment further includes an external terminal P1 and an external terminal P2. The external terminal P1 connects to a resistor Rop for converting currents into voltages or vice versa outside the chip. The external terminal P2 connects to a resistor Rsc. The drain terminal of the current-mirror transistor Q2 is connected to the external terminal P1. The drain terminal of the current-mirror transistor Q3 is connected to the external terminal P2. The regulator IC 10 further includes a comparator CMP1 for detecting an open-circuit fault and a comparator CMP2 for detecting a short-circuit fault. The inverting input terminal of the comparator CMP1 is connected to the external terminal P1, and the non-inverting input terminal of the comparator CMP1 receives a reference voltage Vref1. The non-inverting input terminal of the comparator CMP2 is connected to the external terminal P2, and the inverting input terminal of the comparator CMP2 receives a reference voltage Vref1.

The resistivity of the external resistor Rop is set such that the voltage between the terminals of the resistor Rop becomes equal to the reference voltage Vref1 when a relatively small detection current indicating an open-circuit fault flows through the voltage-control transistor Q1. The resistivity of the external resistor Rsc is set such that the voltage between the terminals of the resistor Rsc becomes equal to the reference voltage Vref1 when a relatively large detection current indicating a short-circuit fault flows through the voltage-control transistor Q1.

Thus, in this embodiment, current values for detecting an open-circuit fault and a short-circuit fault are set using the external resistors Rop, Rsc. These current values (thresholds) for detection can be set as desired depending on the system to be used. Further, the comparators CMP1, CMP2 can use the same reference voltage Vref1. This can simplify the circuit that generates the reference voltage.

The regulator IC 10 in this embodiment further includes a delay circuit 16, a latch circuit 17, a NOR gate G1, an OR gate G2, and AND gates G3, G4 to prevent detection errors due to rush currents. The delay circuit 16 includes a resistor and a capacitor and delays outputs of the comparators CMP1, CMP2. The latch circuit 17 captures and holds the output of the delay circuit 16. The NOR gate G1 calculates the logical sum of the outputs of the comparators CMP1, CMP2. The OR gate G2 calculates the logical sum of the output of the NOR gate G1 and the output of the latch circuit 17 and inputs the logical sum to the delay circuit 16. The AND gates G3, G4 each calculate the logical product of the output of the latch circuit 17 and the undelayed output of the comparators CMP1, CMP2.

The regulator IC 10 in this embodiment further includes N-channel MOS transistors Q5, Q6. The gate terminal of the transistor Q5 receives the output of the AND gate G3. The gate terminal of the transistor Q6 receives the output of the AND gate G4. The regulator IC 10 further includes external terminals P3, P4 for outputting signals to an external CPU or other devices with an open-drain method. The drain terminal of the transistor Q5 is connected to the external terminal P3. The drain terminal of the transistor Q6 is connected to the external terminal P4.

The regulator IC 10 in this embodiment determines that a short circuit occurs when a relatively large current flows toward the output terminal. On the other hand, a relatively large rush current (inrush current) flows toward the capacitor Co at the output terminal when the IC is activated. The short-circuit-fault detection comparator CMP2 in the regulator IC 10 cannot distinguish the rush current from the current caused by a short circuit and flowing into the output terminal. Therefore, when the regulator IC 10 does not include the delay circuit 16, the regulator IC 10 cannot restrain the comparator CMP2 from outputting error pulses (signals) when detecting the rush current. To deal with the above issues, the regulator IC 10 includes the delay circuit 16 so as not to output detection error signals when detecting the rush current.

The delay circuit 16 includes: a constant current source I1; a switch transistor Qs connected in series to the constant current source I1; and a comparator CMP3 that receives, as inputs, a predetermined reference voltage Vref2 and the potential of the connecting node N1 that connects the constant current source I1 and the transistor Qs. The gate terminal of the transistor Qs receives the output voltage of the OR gate G2. The delay circuit 16 further includes an external terminal CD connected to the connecting node N1. The external terminal CD is connected to an external capacitor Cd that is charged by the constant current source I1. Thus, the delay circuit 16 can increase the delay time without increasing the chip size.

Further, a P-MOS transistor Qc is connected between the node N1 and a ground point. The gate terminal of the transistor Qc receives a predetermined bias voltage Vb. The threshold voltage of the P-MOS transistor Qc is Vthp. When the potential of the node N1 becomes equal to or greater than Vb+Vthp, the transistor Qc turns on and allows currents to flow, thereby functioning as a clamping means. Accordingly, the transistor Qc can prevent increase of the potential of the node N1 far beyond the threshold and therefore can prevent increase of time for discharging the capacitor Cd when an open-circuit state changes to a short-circuit state or vice versa. When the external terminal CE shifts to low-level, the regulator IC stops operation and the gate terminal of the clamping transistor Qc shifts to low-level, so that the transistor Qc turns on. This allows the capacitor Cd to be swiftly discharged.

In the normal operation mode of the regulator IC 10, the outputs of the comparators CMP1, CMP2 are low-level. In the delay circuit 16 under the normal operation mode, the output of the NOR gate G1 is high-level, and the OR gate G2 applies its high-level output to the gate terminal of the transistor Qs, so that the transistor Qs is on and the capacitor Cd is discharged. When either the comparator CMP1 or CMP2 detects an open circuit/short circuit and outputs a high-level output, the output of the NOR gate F1 changes to low level. As the output of the latch circuit 17 immediately before the OR gate G2 is low-level, the output of the OR gate G2 changes to low level. Accordingly, the transistor Qs turns off.

Then, the capacitor Cd is gradually charged, and the potential of the connecting node N1 gradually increases. When a predetermined time has passed and the potential of the connecting node N1 becomes higher than the reference voltage Vref2 of the comparator CMP3, the output of the comparator CMP3 changes from low-level to high-level. This high-level output of the comparator CMP3 is captured by the latch circuit 17, so that the output of the latch circuit 17 changes to high level. Thus, when an open circuit is detected, the output of the AND gate G3 changes to high level; the transistor Q5 turns on; and the external terminal P3 changes from high-level to low-level.

When a short circuit is detected, the output of the AND gate G4 changes to high level; the transistor Q6 turns on; and the external terminal P4 changes from high-level to low-level. The delay time of the delay circuit 16 is set to be slightly longer than the period of time during which the rush current flows. As described above, the regulator IC 10 including the delay circuit 16 and the AND gates G3, G4 restrains occurrence of error pulses when detecting the rush current.

The reset terminal of the latch circuit 17 receives the output of the NOR gate G1. When an open-circuit/short-circuit state is resolved, the outputs of the comparators CMP1, CMP2 both become low-level, and the output of the NOR gate G1 becomes high-level. With the high-level output of the NOR gate G1, the latch terminal 17 is reset and the output thereof becomes low-level. Accordingly, the outputs of the AND gates G3, G4 become high-level, the transistors Q5, Q6 turn off, and the external terminals P3, P4 become high-level. Thus, the terminals P3, P4 are in a state of not outputting signals indicating detection of faults.

Figure 2:
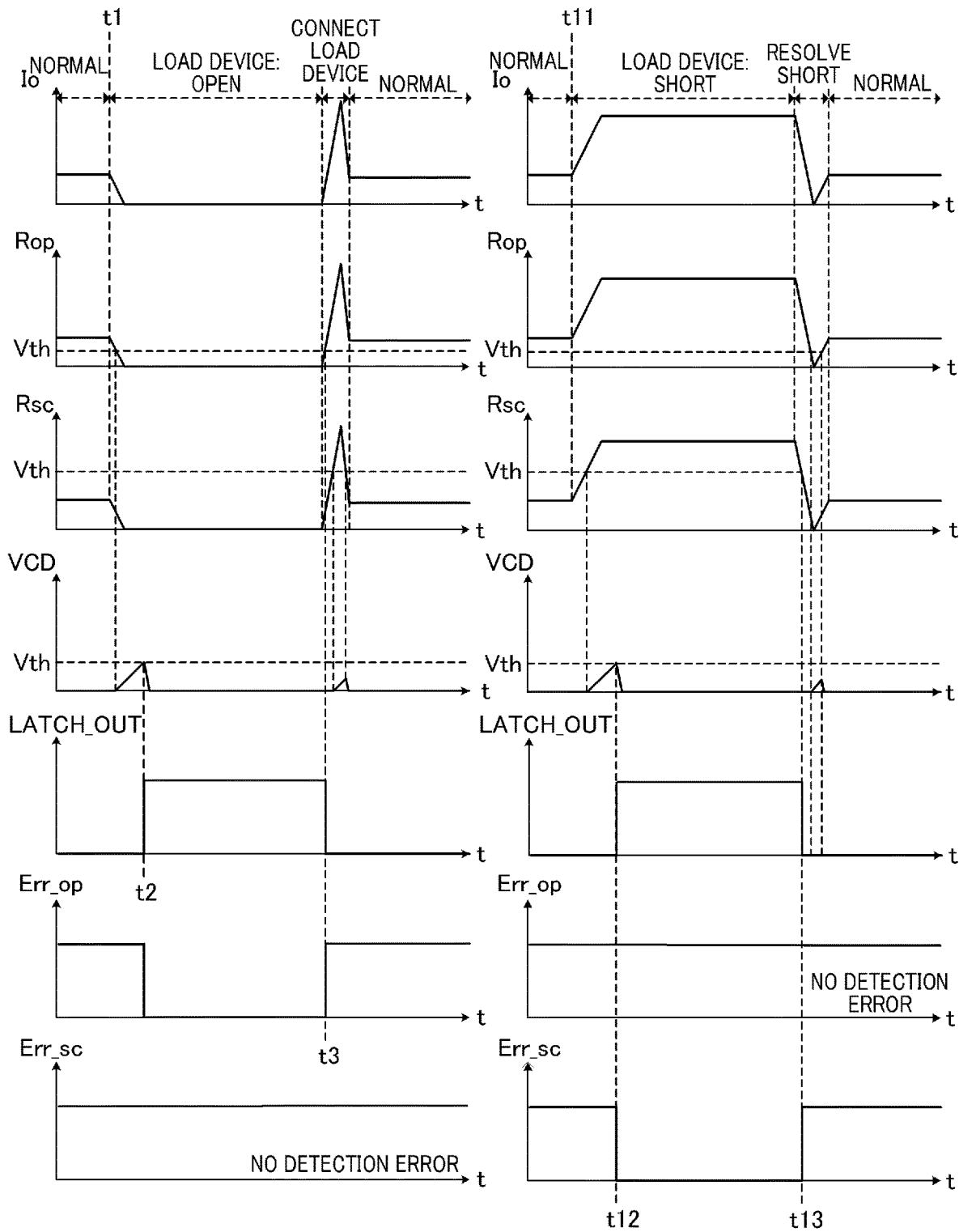
FIG. 2A is a timing chart showing changes in voltage at each part of the regulator IC in the embodiment in FIG. 1 when an open-circuit fault occurs and is resolved thereafter.
FIG. 2B is a timing chart showing changes in voltage at each part of the regulator IC in the embodiment in FIG. 1 when a short-circuit fault occurs and is resolved thereafter.

Next, the operation of the regulator IC 10 in this embodiment is described with reference to the timing chart in FIG. 2. FIG. 2A shows timings in a case where the load device that has not been connected to the output terminal OUT is connected to the output terminal OUT. FIG. 2B shows timings in a case where a short circuit occurs in the load device and is resolved.

In FIG. 2A, at the timing t1, the load device is disconnected from the output terminal OUT, and the terminal OUT that has been in a normal state becomes open. As the output current Io stops flowing, the voltage Vp1 at the external terminal P1 decreases and the output of the open-circuit-fault detection comparator CMP1 becomes high-level. Accordingly, the transistor Qs in the delay circuit 16 turns off; the external capacitor Cd connected to the external terminal CD is gradually charged; and the voltage VCD of the capacitor Cd gradually increases.

When the voltage VCD reaches the voltage Vref2, which is the threshold of the comparator CMP3, the output of the CMP3 becomes high-level. The high-level output of the comparator CMP3 is captured by the latch circuit 17, the output LATCH_OUT becomes high-level, and the open-circuit-fault detection signal Err_op becomes low-level (timing t2). With the change of the output LATCH_OUT of the latch circuit 17 to high-level, the output of the OR gate G2 becomes high-level, so that the transistor Qs turns on. Accordingly, the external capacitor Cd connected to the external terminal CD is discharged and its voltage VCD decreases.

When the load device is connected to the output terminal at the timing t3 and the open circuit is resolved, a large output current Io (rush current) flows in a short time to charge the output capacitor Co. The current-mirror transistors Q2, Q3 also flow current proportional to the output current Io, which leads to a rapid increase in the voltages Vp1, Vp2 of the external terminals P1, P2. The short-circuit-fault detection comparator CMP2 detects the increase of the Vp2, and the output of the CMP2 becomes high-level.

As a result, the transistor Qs in the delay circuit 16 turns off; the external capacitor Cd at the external terminal CD is charged; and the voltage VCD gradually increases. Before the voltage VCD reaches the voltage Vref2, which is the threshold of the comparator CMP3, the transistor Qs turns on and the capacitor Cd is discharged. Accordingly, the potential of the voltage VCD decreases. Thus, the output of the comparator CMP3 does not become high-level. This restrains the short-circuit-fault detection signal Err_sc, which is output from the external terminal P4, from wrongly changing to high-level. As the clamping transistor Qc restrains increase of the voltage VCD, the capacitor Cd may need shorter time for discharge.

The output of the open-circuit-fault detection comparator CMP1 becomes low-level at the timing t3 at which the rush current flows, and the output of the AND gate G3 becomes low-level, so that the transistor Q5 turns off. Accordingly, the open-circuit-fault detection signal Err_op becomes high-level. At the timing when the output of the open-circuit-fault detection comparator CMP1 becomes low-level, the latch circuit 17 is reset and the output thereof becomes low-level. Accordingly, the output of the AND gate G3 is kept low-level, and the open-circuit-fault detection signal Err_op is kept high-level.

In FIG. 2B, the load device shifts from a short-circuit state to a normal state. When a short circuit occurs in the load device at the timing t11, the output current Io rapidly increases and the voltage Vp2 of the external terminal p2 increases. Accordingly, the output of the comparator CMP2 becomes high-level. Accordingly, the transistor Qs in the delay circuit 16 turns off; the external capacitor Cd connected to the external terminal CD is gradually charged; and the voltage VCD of the capacitor Cd gradually increases.

When the voltage VCD of the external terminal CD reaches the voltage Vref2, which is the threshold of the comparator CMP3, the output of the CMP3 becomes high-level. The high-level output of the comparator CMP3 is captured by the latch circuit 17, the output LATCH_OUT changes to high-level, and the short-circuit-fault detection signal Err_sc becomes low (timing t12). With the change of the output LATCH_OUT of the latch circuit 17 to high-level, the output of the OR gate G2 becomes high-level, so that the transistor Qs turns on. Accordingly, the external capacitor Cd connected to the external terminal CD is discharged and the voltage VCD decreases.

When the short circuit of the load device connected to the output terminal is resolved at the timing t13, the output current Io rapidly decreases. Along with the decrease of the output current Io, the currents flowing through the current-mirror transistors Q2, Q3 also decrease, which leads to a decrease in the voltages Vp1, Vp2 at the external terminals P1, P2. The open-circuit-fault detection comparator CMP1 detects the decrease of the voltage Vp1, and the output of the CMP1 becomes high-level.

As a result, the transistor Qs in the delay circuit 16 turns off; the external capacitor Cd at the external terminal CD is charged; and the voltage VCD gradually increases. Before the voltage VCD reaches the voltage Vref2, which is the threshold of the comparator CMP3, the transistor Qs turns on and the capacitor Cd is discharged. Accordingly, the potential of the voltage VCD decreases. Thus, the output of the comparator CMP3 does not become high-level. This restrains the open-circuit-fault detection signal Err_op, which is output from the external terminal P3, from wrongly becoming high-level. As the clamping transistor Qc restrains increase of the voltage VCD, the capacitor Cd may need shorter time for discharge.

The output of the short-circuit-fault detection comparator CMP2 becomes low-level at the timing t13 at which the output current decreases, and the output of the AND gate G4 changes to low-level, so that the transistor Q6 turns off. Accordingly, the short-circuit-fault detection signal Err_sc becomes high-level. At the timing when the output of the short-circuit-fault detection comparator CMP2 becomes low-level, the latch circuit 17 is reset and the output thereof becomes low-level. Accordingly, the output of the AND gate G4 is kept low-level, and the short-circuit-fault detection signal Err_sc is kept high-level.

As described above, the regulator IC in the above embodiment can restrain occurrence of error pulses on the short-circuit-fault detection signal Err_sc and on the open-circuit-fault detection signal Err_op in both cases where: the load device that has not been connected to the output terminal is connected to the output terminal; and a short circuit in the load device is resolved.

(Modification)

Next, a modification of the regulator IC in the above embodiment is described with reference to FIG. 3 and FIG. 4.

Figure 3:
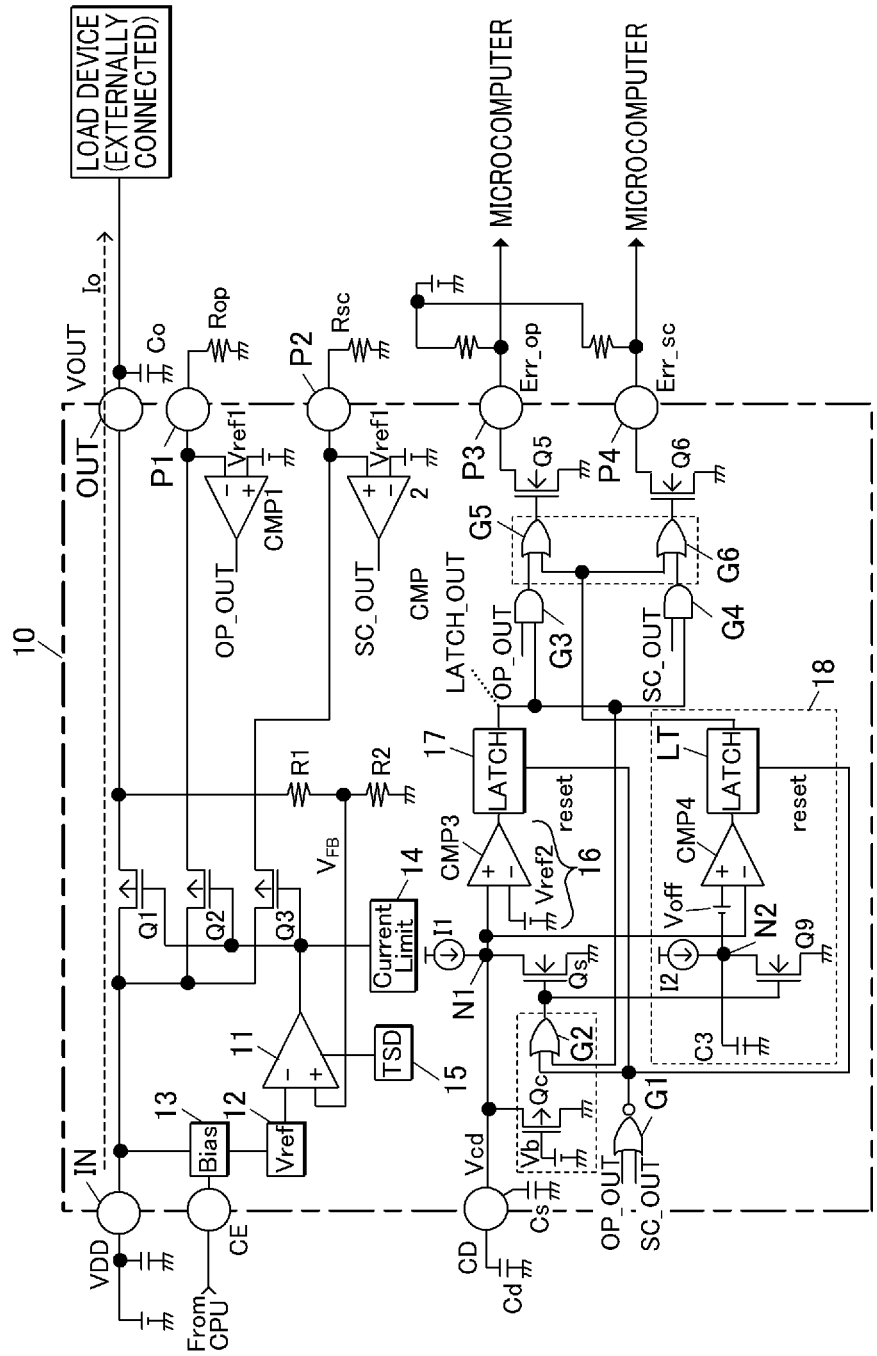
FIG. 3 shows a circuit configuration of a modification of the regulator IC in the embodiment shown in FIG. 1.

FIG. 3 shows a configuration of the regulator IC in a modification. The modification in FIG. 3 includes an abnormal-delay-time detection circuit 18 and OR gates G5, G6. With these components, the modification is configured to notify faults by outputting fault-detection signals Err_op, Err_sc when the delay time is abnormally long owing to disconnection of the capacitor Cd from the external terminal CD, for example. FIG. 3 includes a capacitor Cs that is not shown in FIG. 1. This capacitor Cs is a parasitic capacitance of the external terminal CD.

The abnormal-delay-time detection circuit 18 includes a constant current source I2, a transistor Q9, a capacitor c3, a comparator CMP4, and a latch circuit LT. The transistor Q9 is for discharge and connected in series to the constant current source I2. The capacitor C3 is connected to the connecting node N2 that connects the constant current source I2 and the transistor Q9. The comparator CMP4 compares the potential of the connecting node N1 in the delay circuit 16 with the potential that is the total of the potential of the node N2 and a predetermined offset voltage Voff. The latch circuit CL captures and holds the output of the comparator CMP4. The gate terminal of the transistor Q9 receives the output voltage of the OR gate G2. The latch circuit LT is configured to be reset by the output of the NOR gate G1, which is also applied to the delay circuit 16.

Further, OR gates G5, G6 are provided in the post stage of the AND gates G3, G4. One input terminal of the OR gate G5 and one input terminal of the OR gate G6 both receive the output of the latch circuit LT in the abnormal-delay-time detection circuit 18.

The constant current source I2 and the capacitor C3 constitute a circuit that generates a reference delay time Tsd. The reference delay time Tsd is represented by Tsd=C3×(Vref2−Voff)/I2. The comparator CMP4 compares the reference delay time Tsd and the delay time Td of the delay circuit 16 to determine whether the delay time Td is abnormal. Herein, T1 is a time required for the voltage VCD at the terminal CD to reach the voltage Vref2 when the capacitor Cd is not connected to the terminal CD. T2 is a time required for the voltage VCD at the terminal CD to reach the voltage Vref2 when the capacitor Cd is connected to the terminal CD. Values of I1, Cd, I2, C3 are determined so as to satisfy T2>Tsd>T1. According to the abnormal-delay-time detection circuit 18 configured as described above, when Td (delay time of delay circuit 16)>Tsd holds, the output of the comparator CMP4 becomes low-level (capacitor Cd is connected). When Td<Tsd holds, the output of the comparator CMP4 becomes high-level (capacitor Cd is not connected). The output of the comparator CMP4 is captured and held by the latch circuit LT, and then applied to the OR gates G5, G6 that control the gate terminals of the transistors Q5, Q6.

FIG. 4A shows changes in signals in a case where the capacitor Cd is connected to the terminal CD. FIG. 4B shows changes in signals in a case where the capacitor Cd is not connected to the terminal CD. Table 1 shows the correlation of the fault detection signals Err_op, Err_sc and states of the regulator IC in FIG. 3.

TABLE 1

|  | NORMAL | OPEN | SHORT | ABNORMAL DELAY |
|---|---|---|---|---|
| Err_op | HIGH | LOW | HIGH | LOW |
| Err_sc | HIGH | HIGH | LOW | LOW |

As shown in FIGS. 4A, 4B, in the case where the capacitor Cd is connected, the transistors Q5, Q6 turn off in the normal state, as with the transistors Q5, Q6 in the regulator IC of the above embodiment, and the fault-detection signals Err_op, Err_sc are both high-level. When an open-circuit fault occurs and the comparator CMP1 detects the open-circuit fault, Err_op becomes low-level and Err_sc is kept high-level.

On the other hand, in the case where the capacitor Cd is not connected, the output of the abnormal-delay-time detection circuit 18 causes the OR gates G5, G6 to be high-level; the transistors Q5, Q6 both turn on; and the fault detection signals Err_op. Err_sc are both low-level. Therefore, the CPU that receives these signals can determine that, when the fault detection signals Err_op, Err_sc are both low-level, the delay capacitor Cd is disconnected.

Figure 5A:
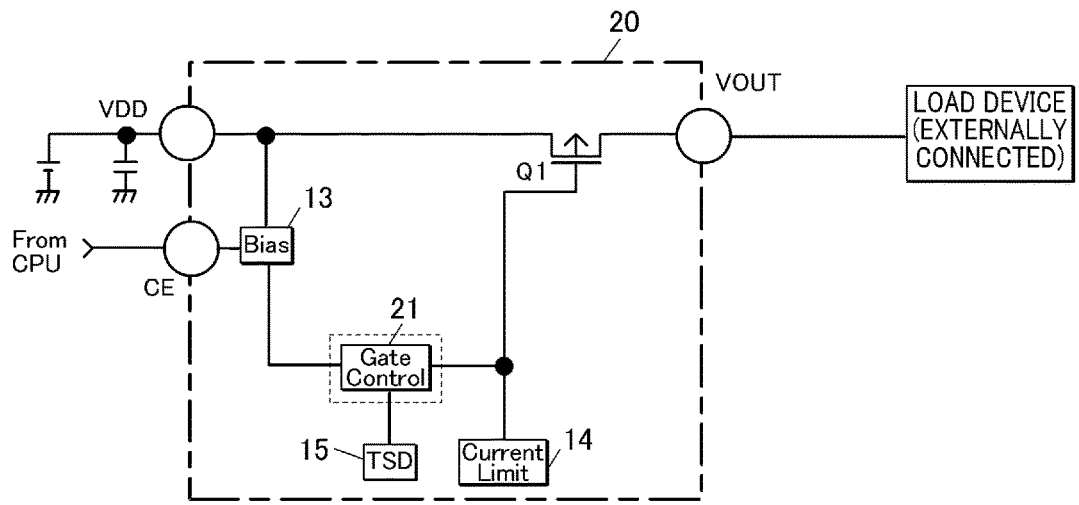
FIG. 5A shows an example circuit configuration of a typical power supply switch IC.

In the above embodiment, the present invention is applied to a regulator IC. The present invention, however, is also applicable to a power supply switch IC 20 as shown in FIG. 5A. The power supply switch IC 20 supplies the voltage of a power supply device (e.g., battery) to a load without change and stops supplying the voltage. The power supply switch IC shown in FIG. 5A includes a gate control circuit 21 instead of the error amplifier in the regulator IC. The gate control circuit 21 is configured to control the output transistor Q1 to be fully on or fully off, depending on whether the control terminal CE is at high level or low level.

Figure 5B:
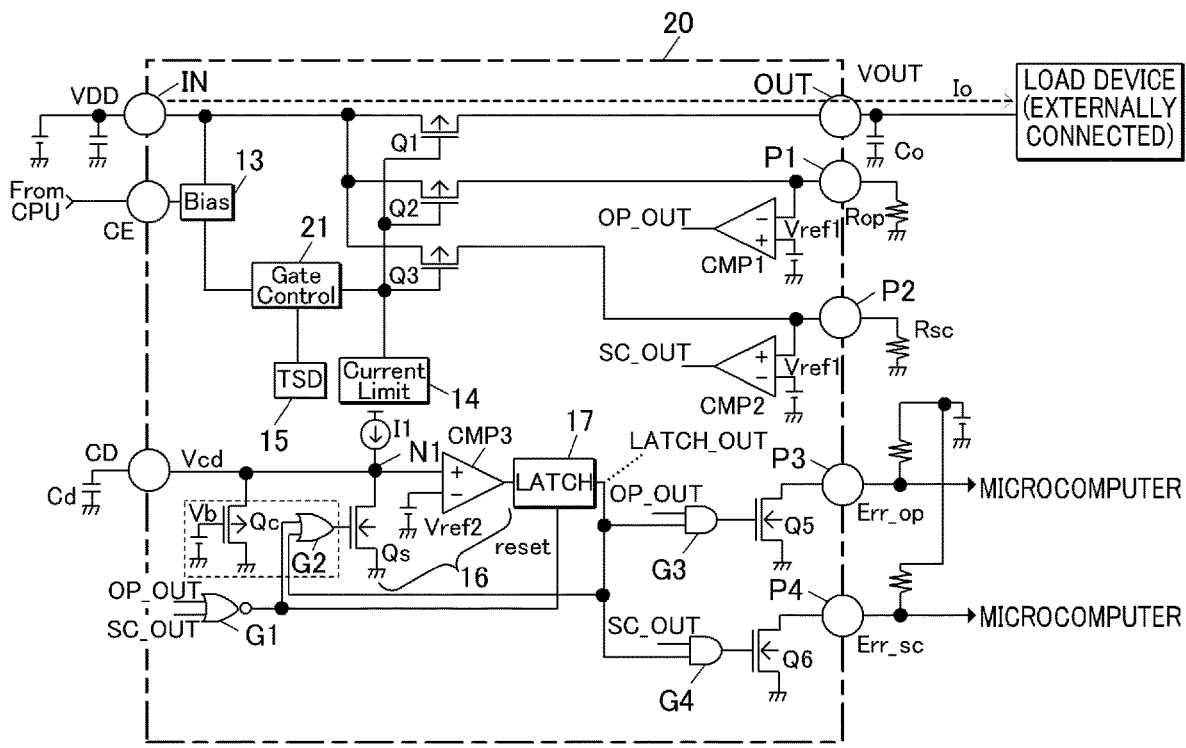
FIG. 5B shows an example circuit configuration of a power supply switch IC that includes an open-circuit-fault detection circuit and a short-circuit-fault detection circuit and to which the present invention is applied.
Figure 6:
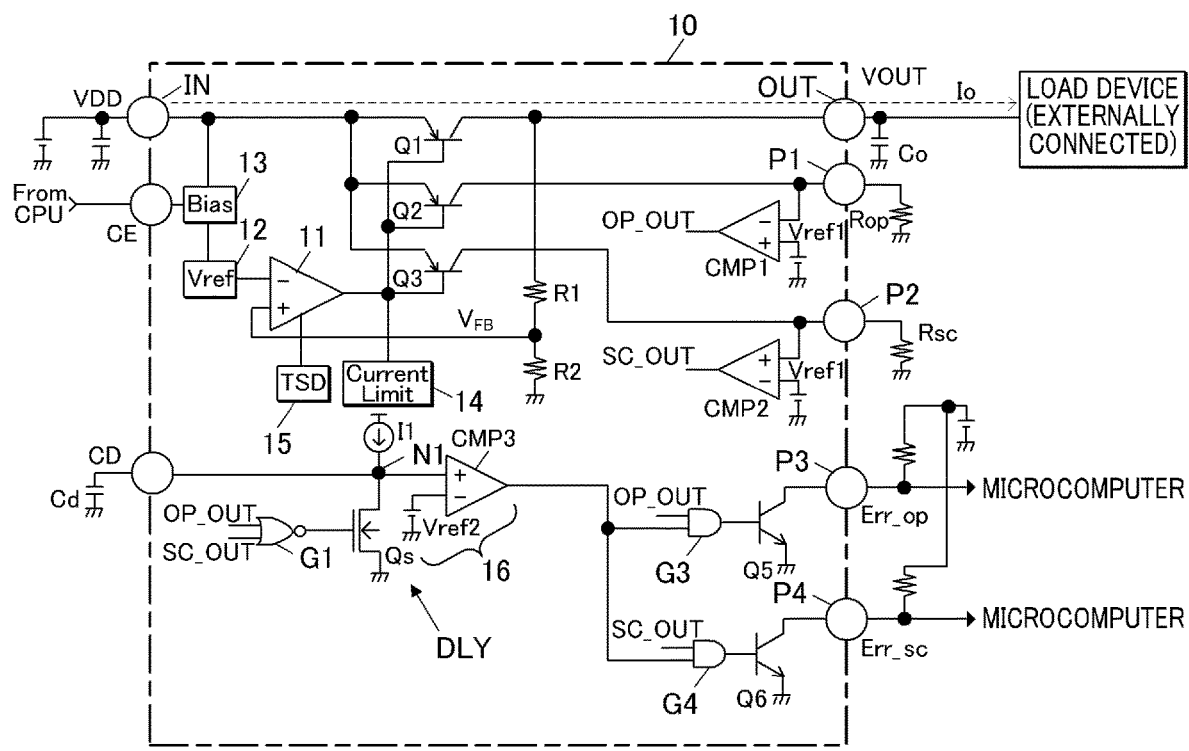
FIG. 6 is an example circuit configuration of a known regulator IC including an open-circuit-fault detection circuit and a short-circuit-fault detection circuit.
Figure 7A:
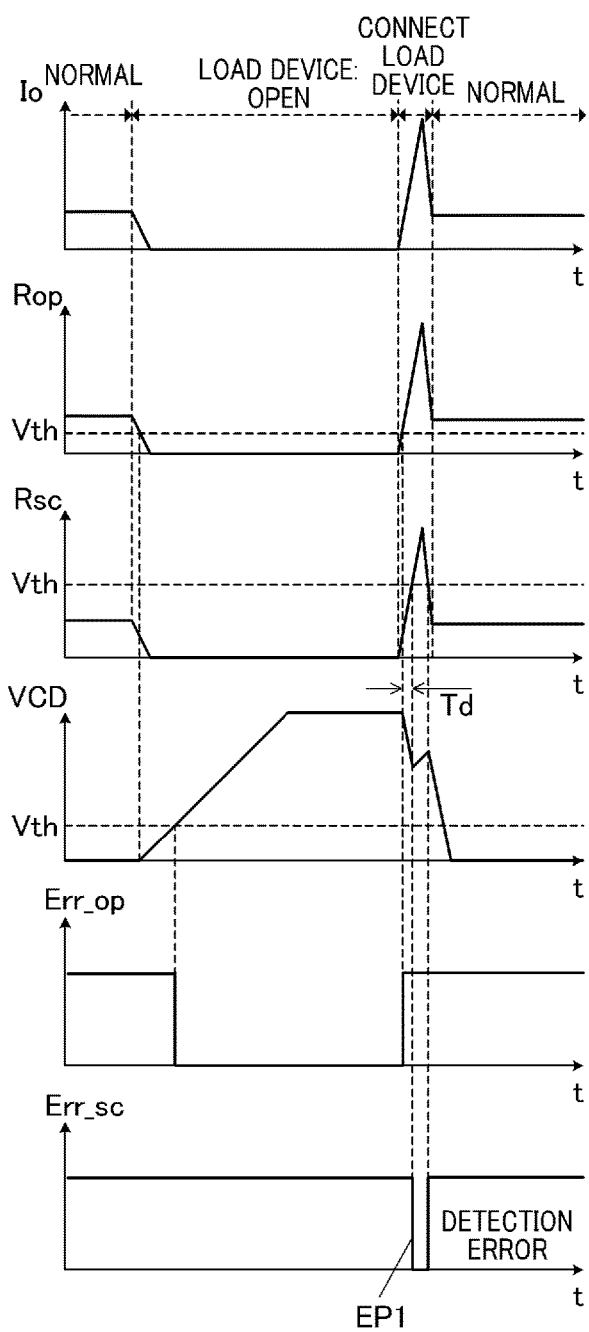
FIG. 7A is a timing chart showing changes in voltage at each part of the known regulator IC in FIG. 6 when an open-circuit fault occurs and is resolved thereafter.
Figure 7B:
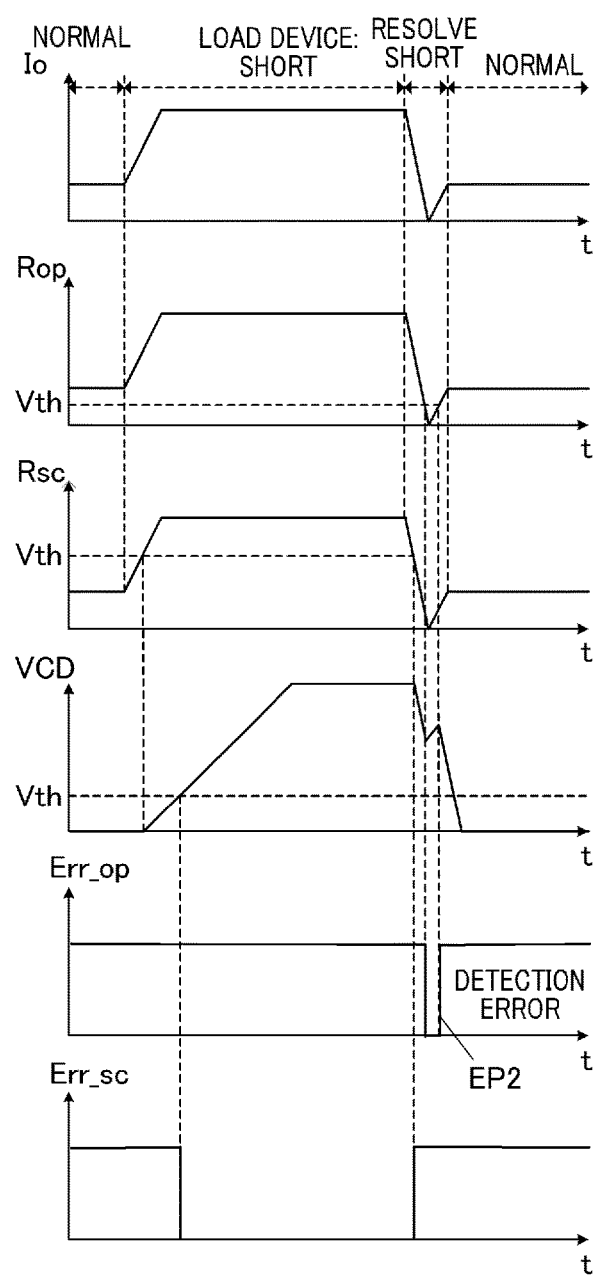
FIG. 7B is a timing chart showing changes in voltage at each part of the known regulator IC in FIG. 6 when a short-circuit fault occurs and is resolved thereafter.

FIG. 5B shows an example of applying the present invention to the power supply switch IC in FIG. 5A. The configuration of the regulator IC in FIG. 3 (modification) is also applicable to the power supply switch IC in FIG. 5A in a way shown in FIG. 5B. Such a power supply switch IC 20 can also achieve advantageous effects similar to the effects of the above embodiment.

As described above, according to the present invention, the power supply IC includes: an output transistor connected between a voltage-input terminal to which a DC voltage is input and a voltage-output terminal; a control circuit that controls the output transistor; a first-fault detection circuit that detects a first fault; a second-fault detection circuit that detects a second fault different from the first fault; a delay circuit that delays an output of the first-fault detection circuit and an output of the second-fault detection circuit; and a latch circuit that captures and holds an output of the delay circuit, wherein the delay circuit includes: a constant current source for charging a delay capacitor; a discharge switch for discharging the delay capacitor; and a voltage comparator circuit that compares a charge voltage across the delay capacitor and a predetermined voltage.

According to the power supply IC configured as described above, when it is determined that the charge voltage of the delay capacitor reaches a predetermined voltage, the output of the voltage comparator circuit in the delay circuit changes. The output of the voltage comparator circuit is captured by the latch circuit, so that the delay capacitor is discharged. This can restrain increase of the voltage of the delay capacitor to a too high level. Accordingly, the power supply IC (regulator IC or power supply switch IC) including circuits for detecting two types of faults (e.g., short-circuit and open-circuit faults of the output terminal) and a delay circuit for delaying fault detection signals can avoid occurrence of error pulses on the fault detection signals when fault states are resolved.

Preferably, the first-fault detection circuit may detect a short circuit at the voltage-output terminal; in response to the output of the first-fault detection circuit or the output of the second-fault detection circuit indicating a fault, the discharge switch turns off so that the delay capacitor starts to be charged; in response to the voltage comparator circuit determining that the voltage of the delay capacitor reaches the predetermined voltage, an output of the voltage comparator circuit changes; and in response to the latch circuit capturing the changed output of the voltage comparator circuit, the discharge switch turns on so that the delay capacitor is discharged.

Preferably, the power supply IC may further include an upper-voltage limiter that limits the charge voltage across the delay capacitor to an upper limit.

According to the above configuration, the upper-voltage limiter (clamping circuit) can limit the voltage of the delay capacitor to an upper limit. This can shorten the time for discharging the delay capacitor and therefore can avoid occurrence of error pulses on the fault detection signals.

Preferably, the upper-voltage limiter may include a transistor connected between a ground point and a charging terminal of the delay capacitor, and a predetermined voltage may be applied to a control terminal of the transistor while an internal circuit of the power supply semiconductor integrated circuit including the control circuit is active.

According to the above configuration, when the power supply IC is turned off and the internal circuit thereof stops operation, the voltage of the control terminal (gate terminal) of the P-MOS transistor decreases and the P-MOS transistor turns on. This allows the delay capacitor to be swiftly discharged. Accordingly, the power supply IC can avoid malfunctioning when turned on. Further preferably, the delay capacitor may be discharged while the power supply semiconductor integrate circuit is off.

Preferably, the power supply IC may further include a first transistor and a second transistor that are connected in parallel with the output transistor and that flow currents proportionally lower than a current flowing through the output transistor, wherein: the second-fault detection circuit detects an open circuit of the voltage-output terminal; the first-fault detection circuit includes a first voltage comparator circuit that compares a voltage that is converted from a current flowing through the first transistor and a predetermined reference voltage and determines which of the voltage that is converted from the current flowing through the first transistor and the predetermined reference voltage is greater; the second-fault detection circuit includes a second voltage comparator circuit that compares a voltage that is converted from a current flowing through the second transistor and a predetermined reference voltage and determines which of the voltage that is converted from the current flowing through the second transistor and the predetermined reference voltage is greater; in response to the current flowing through the first transistor being greater than a predetermined short-circuit-fault detection current, the first voltage comparator circuit outputs a signal indicating a short-circuit fault; and in response to the current flowing through the second transistor being lower than a predetermined open-circuit-fault detection current, the second voltage comparator circuit outputs a signal indicating an open-circuit fault.

According to the above configuration, the power supply IC including circuits for detecting a short circuit and an open circuit of an output terminal can avoid occurrence of error pulses on the fault detection signals when a short circuit/open circuit is resolved.

Preferably, the power supply IC may further include: a first output terminal that outputs a detection result of the first-fault detection circuit to outside; a second output terminal that outputs a detection result of the second-fault detection circuit to outside; and an abnormal-delay-time detection circuit that detects whether a delay time of the delay circuit is within a predetermined time range, wherein in response to the abnormal-delay-time detection circuit detecting an abnormality in the delay time, the first and second output terminals output signals indicating that the abnormality is detected.

According to the above configuration, the power supply IC can detect an abnormality, such as disconnection of the delay capacitor from the external terminal, and output a signal indicating the abnormality to the outside.

According to the present invention, a power supply IC (e.g., regulator IC, power supply switch IC) that includes circuits for detecting two or more types of faults (e.g., short-circuit and open-circuit faults of the output terminal) and a delay circuit for delaying fault detection signals can avoid occurrence of error pulses on the fault detection signals when the fault is resolved. Further, the present invention can realize a power supply IC (e.g., regulator IC, power supply switch IC) capable of outputting abnormality detection signals to outside in response to detecting abnormalities (e.g., the delay capacitor is disconnected from the external terminal).

Although the present invention has been described in detail on the basis of the embodiment, the present invention is not limited to the above embodiment. For example, in the above embodiment, the clamping means that clamps the potential of the external terminal CD is a single MOS transistor Qc. However, the clamping means may be a circuit including a diode or an operational amplifier. Further, although the above embodiment includes both the clamp means (Qc) and the latch circuit 17, a configuration including only the clamp means (Qc) and not including the latch circuit 17 can be provided.

In the above embodiment, the transistors constituting internal circuits of the regulator IC 10 and the power supply switch IC 20 are MOS transistors. The transistors, however, may be bipolar transistors instead of MOS transistors. Further, the delay capacitor Cd may not be an external element but may be formed on the IC chip.

Further, the above embodiment includes: a short-circuit-fault detection circuit and an open-circuit-fault detection circuit as fault detection circuits; and a delay circuit that delays the detection signals of the fault detection circuits. The fault detection circuits, however, are not limited to a combination of the short-circuit-fault detection circuit and the open-circuit-fault detection circuit. The present invention is also applicable to a regulator IC/power supply switch IC that includes other types of fault detection circuits, such as a short-circuit-fault detection circuit and a circuit that monitors the output voltage.

What is claimed is:

1. A power supply semiconductor integrated circuit comprising:
    an output transistor connected between a voltage-input terminal to which a DC voltage is input and a voltage-output terminal;
    a control circuit that controls the output transistor;
    a first-fault detection circuit that detects a first fault;
    a second-fault detection circuit that detects a second fault different from the first fault;
    a delay circuit that delays an output of the first-fault detection circuit and an output of the second-fault detection circuit; and
    a latch circuit that captures and holds an output of the delay circuit, wherein
    the delay circuit includes:
        a constant current source for charging a delay capacitor;
        a discharge switch for discharging the delay capacitor; and
        a voltage comparator circuit that compares a charge voltage across the delay capacitor and a predetermined voltage.

2. The power supply semiconductor integrated circuit according to claim 1, wherein
    the first-fault detection circuit detects a short circuit at the voltage-output terminal,
    in response to the output of the first-fault detection circuit or the output of the second-fault detection circuit indicating a fault, the discharge switch turns off so that the delay capacitor starts to be charged,
    in response to the voltage comparator circuit determining that the charge voltage of the delay capacitor reaches the predetermined voltage, an output of the voltage comparator circuit changes, and
    in response to the latch circuit capturing the changed output of the voltage comparator circuit, the discharge switch turns on so that the delay capacitor is discharged.

3. The power supply semiconductor integrated circuit according to claim 1, further comprising an upper-voltage limiter that limits the charge voltage across the delay capacitor to an upper limit.

4. The power supply semiconductor integrated circuit according to claim 3, wherein
    the upper-voltage limiter includes a transistor connected between a ground point and a charging terminal of the delay capacitor, and
    a predetermined voltage is applied to a control terminal of the transistor while an internal circuit of the power supply semiconductor integrated circuit including the control circuit is active.

5. The power supply semiconductor integrated circuit according to claim 4, wherein the delay capacitor is discharged while the power supply semiconductor integrate circuit is off.

6. The power supply semiconductor integrated circuit according to claim 1, further comprising a first transistor and a second transistor that are connected in parallel with the output transistor and through which currents flow, the currents being proportionally lower than a current flowing through the output transistor, wherein the second-fault detection circuit detects an open circuit of the voltage-output terminal, the first-fault detection circuit includes a first voltage comparator circuit that compares a voltage that is converted from a current flowing through the first transistor and a predetermined reference voltage and determines which of the voltage that is converted from the current flowing through the first transistor and the predetermined reference voltage is greater, the second-fault detection circuit includes a second voltage comparator circuit that compares a voltage that is converted from a current flowing through the second transistor and a predetermined reference voltage and determines which of the voltage that is converted from the current flowing through the second transistor and the predetermined reference voltage is greater, in response to the current flowing through the first transistor being greater than a predetermined short-circuit-fault detection current, the first voltage comparator circuit outputs a signal indicating a short-circuit fault, and in response to the current flowing through the second transistor being lower than a predetermined open-circuit-fault detection current, the second voltage comparator circuit outputs a signal indicating an open-circuit fault.

7. The power supply semiconductor integrated circuit according to claim 1, further comprising:

a first output terminal that outputs a detection result of the first-fault detection circuit to outside;

a second output terminal that outputs a detection result of the second-fault detection circuit to outside; and an abnormal-delay-time detection circuit that detects whether a delay time of the delay circuit is within a predetermined time range, wherein in response to the abnormal-delay-time detection circuit detecting an abnormality in the delay time, the first and second output terminals output signals indicating that the abnormality is detected.

* * * * *

UNITED STATES PATENT AND TRADEMARK OFFICE
CERTIFICATE OF CORRECTION

PATENT NO. : 11,474,161 B2
APPLICATION NO. : 17/458113
DATED : October 18, 2022
INVENTOR(S) : Kohei Sakurai and Shinichiro Maki It is certified that error appears in the above-identified patent and that said Letters Patent is hereby corrected as shown below:

In the Claims

Column 12, Line 66 (Claim 5, Line 3), delete "integrate" and insert -- integrated --.

Signed and Sealed this
Nineteenth Day of December, 2023

Katherine Kelly Vidal
*Director of the United States Patent and Trademark Office*